United States Patent [19]

Hausdörfer et al.

[11] Patent Number: 4,459,552

[45] Date of Patent: Jul. 10, 1984

[54] LOW-NOISE VIDEO PREAMPLIFIER

[75] Inventors: Michael Hausdörfer; Klaus Lehmann, both of Mühltal, Fed. Rep. of Germany

[73] Assignee: Robert Bosch GmbH, Stuttgart, Fed. Rep. of Germany

[21] Appl. No.: 377,601

[22] Filed: May 13, 1982

[30] Foreign Application Priority Data

May 19, 1981 [DE] Fed. Rep. of Germany ....... 3119871

[51] Int. Cl.$^3$ .............................................. H03F 3/38
[52] U.S. Cl. ........................................ 330/10; 330/251
[58] Field of Search ................... 330/10, 207 A, 251; 329/50, 146

[56] References Cited

PUBLICATIONS

B. Moulds, "Variable Cutoff Filters", IBM Tech. Dis. Bulletin, vol. 7, No. 12, May 1965.
I. Macleod, "On the Bandwidth of Carrier-Type DC Amplifiers", IEEE Transactions on Circuit Theory, vol. CT-17, No. 3, Aug. 1970.

Primary Examiner—James B. Mullins
Assistant Examiner—G. Wan
Attorney, Agent, or Firm—Frishauf, Holtz, Goodman & Woodward

[57] ABSTRACT

For reduction of the relative noise amplitude a modulator or chopper stage is provided in front of the input of a video preamplifier and at the preamplifier output balanced demodulators are provided with a subtraction circuit combining their outputs. Preferably the carrier wave used for chopping or modulation is applied to the demodulators for synchronous demodulation, with a phase shifter if necessary in the carrier supplied to the demodulators for compensation of the signal propagation time through the preamplifier.

7 Claims, 6 Drawing Figures

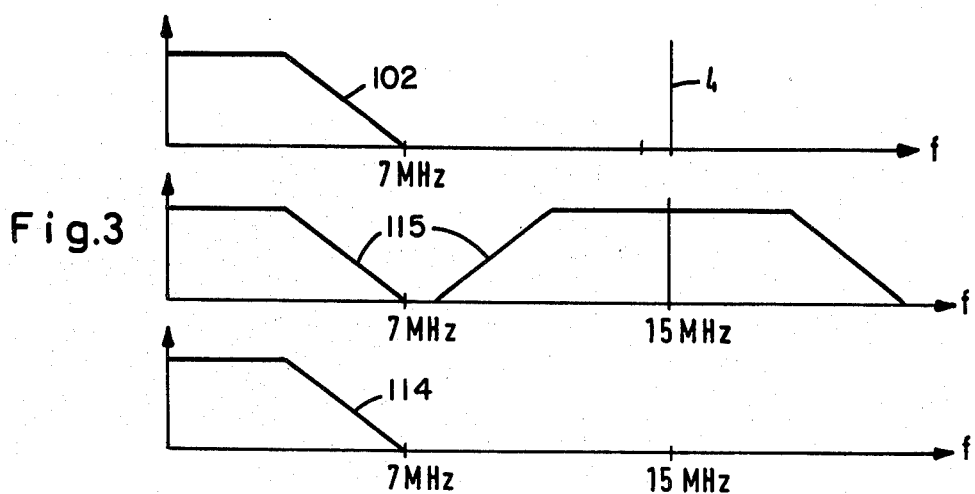
Fig.3
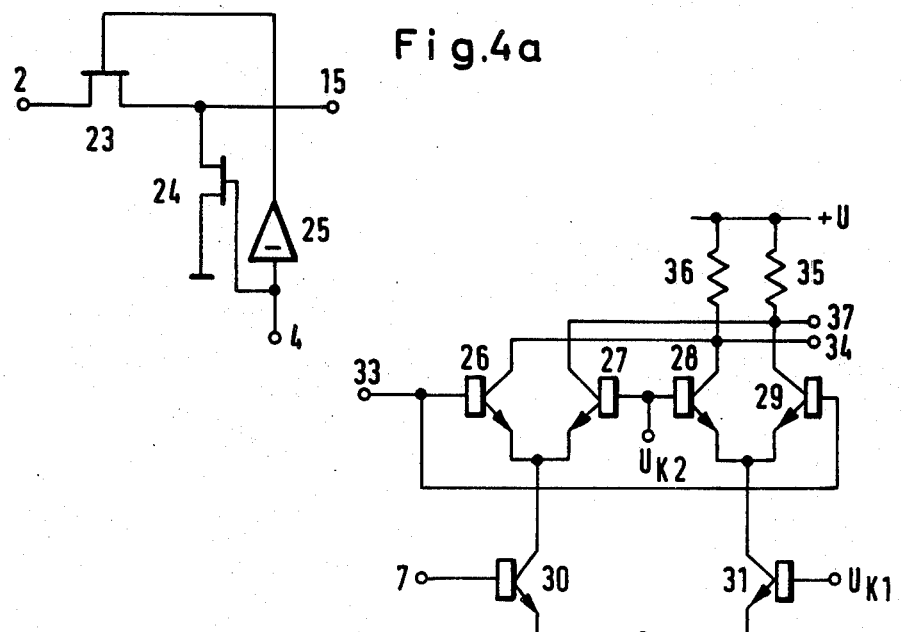
Fig.4a
Fig.4b

LOW-NOISE VIDEO PREAMPLIFIER

This invention concerns an amplifier for video signals that are at such low levels of amplitude that noise occuring in the amplifier presents a serious problem.

The amplitude of the output signals of television camera tubes is so small that an impairment of the quality of the reproduced television picture results from noise in the video amplifier. For a given value of the signal-to-noise ratio the light intensities required depend directly on the noise amplitude. For this reason video amplifiers have been developed that are particularly low in noise introduced into the signal. Such a video amplifier is described in U.S. Pat. No. 3,582,800.

The circuits utilized in practice as low-noise amplifiers have provided satisfactory improvements in result, but a further improvement of noise immunity is nevertheless of importance, since on the one hand television cameras could then be used at lower light intensities and on the other hand particularly broad band television camera systems would be made possible. Particularly in the latter case a reduction of noise is especially important, since the noise current inflow $I_R$ has the following dependence upon the upper limit frequency $f_c$ of the video signal:

$$I_R = k \cdot f_c^{3/2}.$$

The invention. It is an object of the present invention to provide for noise reduction in video amplifiers for low amplitude signals to an extent not available with existing apparatus.

Briefly, the signal is modulated before amplification with a carrier frequency well above the upper limit frequency of the video signal and then, after amplification the signal is detected by a pair of detectors acting oppositely with respect to the alternations of the carrier frequency and the outputs of the detectors are supplied to a subtraction circuit which furnishes a low-noise amplified output. The circuit operates particularly well when the detectors are synchronous detectors to which carrier waves are respectively fed in opposite phase. Preferably the carrier wave is furnished directly to the modulator, while phase-shift compensation for the signal propogation time through the amplifier is provided between the carrier wave supply and the demodulators.

The invention has the advantage that the noise of the amplifier itself is to a great extent eliminated, so that a substantial improvement of the signal-to-noise ratio results.

The invention is further described by way of illustrative example with reference to the annexed drawings, in which:

BRIEF DESCRIPTION OF THE DRAWINGS

FIG. 3 is a diagram of the spectrum of the signals of FIG. 2;

FIG. 4a is a circuit diagram of a preferred modulator circuit for use in the basic circuit of FIG. 1;

FIG. 4b is a circuit diagram of one form of demodulator for use in the circuit of FIG. 1.

DESCRIPTION OF THE ILLUSTRATED EMBODIMENT

Figure 1:
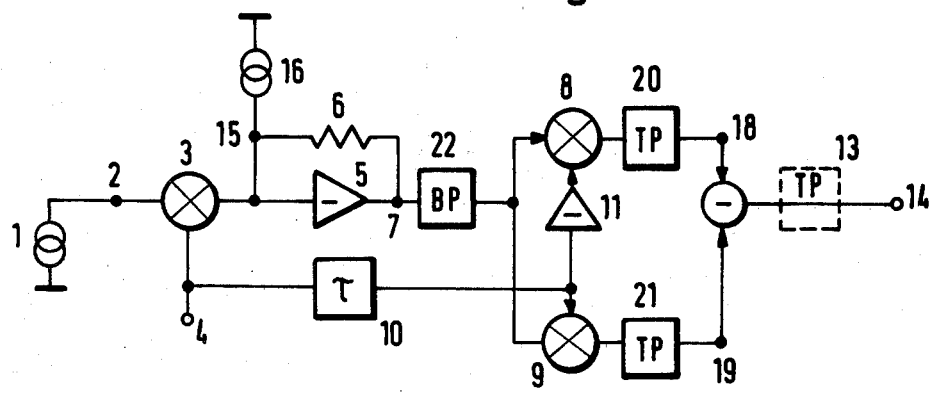
FIG. 1 is a basic circuit diagram of a low-noise video amplifier in accordance with the invention.

Since the commonly used television camera tubes have a very high internal resistance, the signal source 1 in FIG. 1 is shown as a current source. A modulator 3 is connected to the output electrode 2 of the signal source 1. The modulator 3 preferably has a circuit such as the one shown in FIG. 4a, but may have other modulator circuits, for instance the simple diode modulator shown in FIG. 4c. The modulator 3 has a connection to a carrier frequency wave source through the terminal 4 of FIG. 1. The carrier frequency is preferably twice as high as the highest frequency that may appear in the video signal.

The carrier frequency signal modulated with the video signal is then supplied to the amplifier proper 5 which provides the amplification in the circuit of FIG. 1. In the illustrated case the amplifier 5 inverts the signal in addition to amplifying it. The resistance 6 accordingly provides a negative feedback and provides a low dynamic input resistance for the amplifier 5. Amplifiers of the present state of the art are basically useable for the amplifying means 5 of FIG. 1. In selecting an amplifier it is merely necessary to be sure that the bandwidth of the amplifier extends over the frequency range of the modulated carrier, or at least of the immediate neighborhood of the carrier frequency and one of the sidebands. The amplifying factor is chosen to be high enough that at the output of the amplifier 5 a signal amplitude is present that is substantially greater than the noise generated in circuits that may be used in subsequent stages to which the signal may be supplied. For reasons of clarity and presentation the noise sources present in the amplifier 5 are illustrated as an external noise current source 16.

The output of the amplifier 5 is provided to two synchronous demodulators 8 and 9. The carrier frequency supplied at the terminal 4 is supplied to the synchronous demodulators, directly to the demodulator 9 and after inversion in an inverter circuit 11 to the demodulator 8. In order to take account of the propagation time of the signal through the amplifier 5, the carrier can be delayed (phase-shifted) correspondingly in a circuit 10. The outputs of the synchronous demodulators 8 and 9 are respectively connected through low-pass filters 20 and 21 with the inputs of a subtraction circuit 12, at the output of which there is a connection to the output terminal 14 of the preamplifier shown in FIG. 1.

Instead of the low-pass filters 20 and 21 it is also possible to utilize a single low-pass filter 13 interposed at the output of the subtraction circuit 40, as shown in broken lines for the low-pass filter 13.

Figure 2:
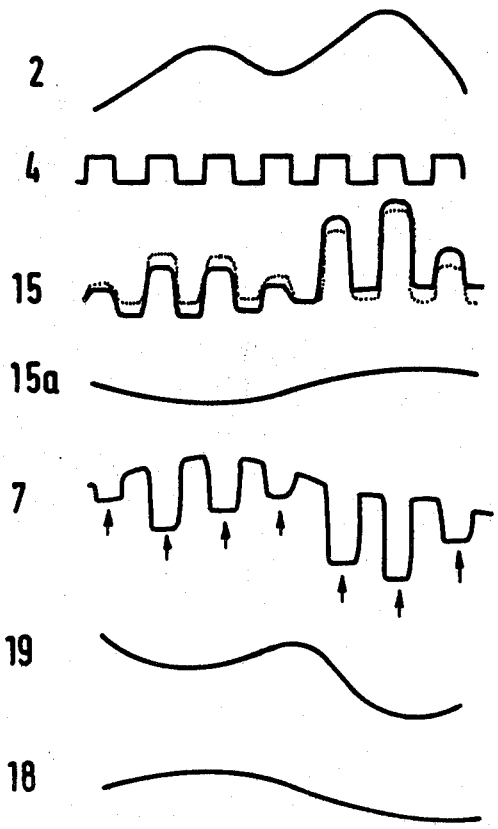
FIG. 2 is a voltage-time diagram showing signals appearing in various places in the circuit of FIG. 1 to the same horizontal time scale.

Voltage-time diagrams related to different points in the circuit of FIG. 1 are shown in FIG. 2. The several lines shown one above another in FIG. 2 and relating to different circuit points are designated at the left by the reference numerals corresponding to the components in FIG. 1 where they appear. Line 2 of FIG. 2 shows a portion of a video signal, while line 4 shows the carrier frequency wave supplied at the terminal 4. The modulator 3, which in the simplest case can be a switching circuit, produces the amplitude-modulated pulses shown in line 15 of FIG. 2, where there are shown in broken lines the amplitude-modulated pulses as generated in the modulator 3, while the corresponding portion in a solid line shows the same pulses as modified by the noise currents from the source 16.

Line 15a of FIG. 2 shows the noise currents alone for illustrating their variation over the period of time in question. At this point it should be noted that the frequencies of the essential components of the noise current as well as the video signal lie below half the carrier frequency.

Line 7 of FIG. 2 shows the output signal of the amplifier 5 on a reduced vertical scale eliminating the amplification for simplicity of illustration.

The synchronous demodulators 8 and 9 may likewise be constituted with simple electronic switches as a double-balanced modulator, with the latter type of circuits being readily available as integrated circuit units. The synchronous demodulator 9 is controlled by the carrier in such a way that it is conducting at each of the locations indicated by arrows on the time diagram of line 7 of FIG. 2. The output of the low-pass filter 21 at the location 19 of FIG. 1 is shown in line 19 of FIG. 2 and it contains the amplified video signal with the superimposed noise component. As a result of the inversion of the carrier in the circuit 11 the synchronous demodulator 8 is put into conducting condition during the other half-waves of the carrier (i.e. the half-waves during which the demodulator 9 is not conducting). At the output of the low-pass filter 22 a demodulated signal is produced that corresponds to the noise current wave illustrated in line 15a. This signal appearing at the circuit point 18 is then subtracted from the signal at the circuit point 19 by the subtraction circuit 40 so that only the amplified video signal remains and is made available for further use at the output 14.

The spectral distribution of the signals utilized in FIG. 1 is shown in FIG. 3. On the top line, the signal designated 102 is the video signal supplied at 2 in FIG. 1, the frequency range of which extends to, for example, 7 MHz. The carrier supply at the terminal 4 accordingly preferably lies at 15 MHz, as shown at 104 on FIG. 3, for a corresponding video signal bandwidth. The spectrum of the signal supplied to the amplifier is illustrated in line 15 of FIG. 3. It includes the baseband as well as the upper and lower sidebands of the modulated carrier. In connection with the present invention it is unimportant whether the amplifier 5 is suitable for transmission of the baseband, because by the subsequent synchronous demodulation followed by low-pass filtering, the sidebands of the modulated carrier are transposed into the region of the baseband, while the original baseband is suppressed, so that the signal spectrum shown in line 114 of FIG. 3 consequently is presented at the output of the circuit of FIG. 1.

Figure 4C:
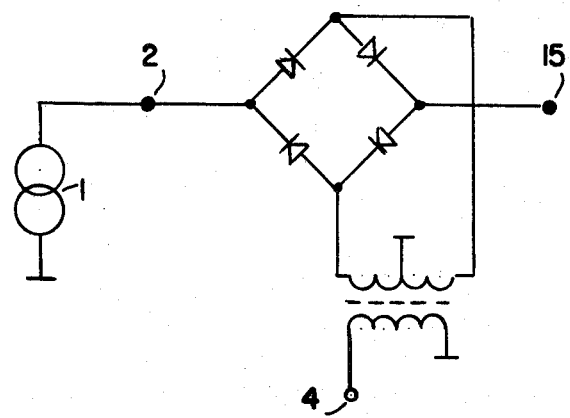
FIG. 4c is a circuit diagram of a simple modulator circuit utilizing a diode, for use in the circuit of FIG. 1.

In FIGS. 4a, 4b and 4c there are shown in more detail certain portions of the circuit of FIG. 1 of particular interest in connection with the present invention.

FIG. 4a shows an illustrative embodiment for the modulator 3 of FIG. 1, which in this case consists essentially of two field effect transistors 23 and 24. The signal is introduced into the circuit at terminal 2. The control electrode of one field effect transistor is directly connected and that of the other is connected through an inverting circuit 25 to the carrier frequency wave provided at the terminal 4. Since the field effect transistors are alternately put into the conducting condition, the resulting signal at the circuit point 15 is the one shown in line 115 of FIG. 3.

The synchronous demodulator can likewise be provided by switches, in which case the switch plus low-pass filter combination for each demodulator corresponds essentially to a sample-and-hold circuit. In order to provide the previously-mentioned modification of FIG. 1 in which a single low-pass filter 13, shown in FIG. 1 in broken lines, is substitued for the low-pass filters 20 and 21, a circuit like FIG. 4b can be provided which shows the circuit of a double balanced modulator that performs the function of the synchronous modulators 8 and 9 and is available as an integrated circuit unit (e.g. under the type designation TCA 240). The double balanced modulator consists essentially of three pairs of emitter-coupled transistors 26 and 27, 28 and 29, 30 and 31. The transistor 32 is connected as a current source by way of which the emitters of the transistors 30 and 31 are supplied from the negative pole $-U$ of a voltage source at constant current. While a constant potential $U_{K1}$ is applied to the base of the transistor 31, the signal to be demodulated is provided from the terminal 7 to the base of the transistor 30. The current supplied through the transistor 32 is distributed between the two transistors 30 and 31 according to the momentary value of the signal.

A constant potential $U_{K2}$ is likewise applied to the bases of the transistors 27 and 28 while the carrier wave is applied from the terminal 33 to the bases of the transistors 26 and 29. The transistors 26–29 operate as switches in such a way that the transistors 29 and 26 are conducting during the positive half-wave of the carrier wave and the transistors 27 and 28 during the negative half-waves. The collectors of the transistors 26 and 28 are connected to the positive pole of the operating voltage source over the resistor 36 and the collectors of the transistors 27 and 29 likewise over the resistor 35. At the output 37 of the circuit of FIG. 4b, during the positive half-waves of the carrier there is produced a signal corresponding to the signal supplied at the terminal 7 which has the same polarity whereas during the negative half-waves there is provided a signal of reversed polarity related to the signal at the input 7. At the output 34 an inverted signal is produced during the positive half-waves of the carrier wave and a noninverted signal during the negative half waves. The additively superimposed noise component is thus reversed from half-wave to half-wave and is therefore filtered out by the following low-pass filter 13 which has its cutoff frequency between the upper band cutoff of the baseband and the lower limit of the lower sideband. Since according to FIG. 2, line 15, only one half-wave is modulated with the signal to be amplified, this signal is not affected by the described polarity reversals, remains therefore in the baseband and can be obtained at the output 14 of the low-pass filter 13. The low-pass filter 13 can be connected either to the output 34 or to the output 37 according to the desired polarity of the output signal.

The above description of the invention illustrates only a modulator which operates as a switch. Furthermore, synchronous demodulators were used for demodulation. As is evident from FIG. 3, the noise superimposed in the baseband by the amplifier is suppressed by the fact that the original baseband is eliminated by the demodulation process and only the demodulated signal is passed on to a later stage. This result can also be successfully obtained by the modulation of the input signal with a sinusoidal carrier. Furthermore, instead of the synchronous demodulators, simple amplitude demodulators can be used, for example, diodes of opposite polarity. Although in the demodulator stage the additional incidental circuit capacitances of the more elaborate demodulators are readily tolerated, there may be advantage in some cases to use a simple diode modulator at the input of the amplifier 5, as shown in FIG. 4c, for reasons of compactness. Finally, it can be advantageous to provide a bandpass filter 22 which passes only the carrier and its sidebands following the output of the amplifier 5.

Although the invention has been described with reference to particular illustrative examples, it will be understood that other modifications and variations are possible within the inventive concept.

We claim:

1. An amplifier for low-amplitude video signals of a spectrum having a maximum frequency $f_m$, said amplifier comprising:

an electrical wave source for providing a carrier wave of a frequency higher than $f_m$ (4);

a modulator (3) at the input of the amplifier for modulating said signals before they are amplified, said modulator having a first input to which said signals are applied and a second input to which said carrier wave is applied from said wave source;

amplification means (5) having a bandwidth including the carrier wave frequency and at least one of the modulation sidebands;

a pair of demodulators (8,9) each having an input connected to the output of said amplification means, the demodulators of said pair being responsive to oppositely poled half waves of said carrier wave;

a subtraction circuit (40) having its inputs connected to the respective outputs of said demodulators, for providing a low-noise amplified video signal.

2. An amplifier as defined in claim 1 in which said demodulators are synchronous demodulators having connections by which said carrier wave is applied to them in simultaneously opposite polarity.

3. An amplifier as defined in claim 2 in which said carrier wave has a frequency at least twice as great as said maximum video spectrum frequency, and in which said wave source, modulator and demodulators are connected so that said carrier wave is applied to said modulator directly and having means (10) interposed between said carrier wave source and said demodulators for compensating for the signal propagation time from input to output in said amplification means (5).

4. An amplifier as defined in claim 1, 2 or 3 in which a low pass filter (13) is provided at the output of said subtraction circuit.

5. An amplifier as defined in claim 1, 2 or 3 in which low pass filters (20,21) are provided at the respective inputs of said subtraction circuit, interposed between the respective demodulators and said subtraction circuit.

6. An amplifier as defined in claim 1, 2 or 3 in which said modulator is constituted by an electronic circuit for passing the input signal over to said amplifying means during a portion of each carrier wave period and for interrupting the input signal during the remaining portion of each carrier wave period.

7. An amplifier as defined in claim 1, 2 or 3 in which said carrier frequency wave source (4) is a source of sinusoidal waves and in which said modulator (3) is a diode modulator.

* * * * *